US012750932B2

(12) United States Patent
Chaji

(10) Patent No.: US 12,750,932 B2
(45) Date of Patent: Sep. 29, 2026

(54) DUAL MICRODEVICE DRIVING

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 173 days.

(21) Appl. No.: 18/249,505

(22) PCT Filed: Nov. 5, 2021

(86) PCT No.: PCT/CA2021/051577
§ 371 (c)(1),
(2) Date: Apr. 18, 2023

(87) PCT Pub. No.: WO2022/094718
PCT Pub. Date: May 12, 2022

(65) Prior Publication Data

US 2023/0422370 A1 Dec. 28, 2023

Related U.S. Application Data

(60) Provisional application No. 63/109,935, filed on Nov. 5, 2020.

(51) Int. Cl.
*H05B 45/30* (2020.01)
*H10H 20/00* (2025.01)
*H10H 29/00* (2025.01)
*H10W 90/00* (2026.01)

(52) U.S. Cl.
CPC ............ *H05B 45/30* (2020.01); *H10W 90/00* (2026.01)

(58) Field of Classification Search
CPC ........ H05B 45/30; H05B 45/40; H05B 45/44; H01L 25/0753; H01L 21/02513; H01L 21/0259; H10H 29/00; H10H 29/14; H10H 20/00; H10H 20/857
See application file for complete search history.

(56) References Cited

U.S. PATENT DOCUMENTS

| | | | | |
|---|---|---|---|---|
| 5,394,028 | A | 2/1995 | Feddeler et al. | |
| 10,395,590 | B1 * | 8/2019 | Lin | G09G 3/32 |
| 10,395,594 | B1 * | 8/2019 | Charisoulis | G09G 3/2018 |
| 2004/0164935 | A1 | 8/2004 | Dedene et al. | |
| 2008/0217712 | A1 | 9/2008 | Rossi et al. | |
| 2009/0212696 | A1 | 8/2009 | Terao | |
| 2011/0062449 | A1 | 3/2011 | Farrell et al. | |
| 2014/0168037 | A1 * | 6/2014 | Sakariya | G09G 3/3216 345/82 |

(Continued)

FOREIGN PATENT DOCUMENTS

| | | | |
|---|---|---|---|
| WO | 2018191551 | A1 | 10/2018 |
| WO | 2020170214 | A1 | 8/2020 |

OTHER PUBLICATIONS

WIPO: PCT International Search Report and Written Opinion relating to PCT application No. PCT/CA2021/051577, dated Feb. 15, 2022.

*Primary Examiner* — Thai Pham

(57) ABSTRACT

The present invention relates to integration of multiple microdevices in pixels and in different combinations and their optimization for different functions. The microdevices may be connected in series and parallel as well have common and separate layers. An integrated combination may have a smoothing function to facilitate switching between different conditions and operations.

19 Claims, 4 Drawing Sheets

(56) References Cited

U.S. PATENT DOCUMENTS

| | | | | |
|---|---|---|---|---|
| 2014/0367633 | A1* | 12/2014 | Bibl | G09F 9/00 257/13 |
| 2016/0005721 | A1 | 1/2016 | Bower et al. | |
| 2018/0174931 | A1* | 6/2018 | Henley | G01R 31/312 |
| 2018/0358405 | A1* | 12/2018 | Chaji | H01L 25/0753 |
| 2020/0013761 | A1* | 1/2020 | Chaji | H10H 20/857 |
| 2021/0202616 | A1* | 7/2021 | Zhang | H10K 59/131 |
| 2022/0208738 | A1* | 6/2022 | Chaji | H10H 20/01 |
| 2024/0032171 | A1* | 1/2024 | Song | H05B 45/37 |

* cited by examiner

DUAL MICRODEVICE DRIVING

BACKGROUND AND FIELD OF THE INVENTION

The present disclosure relates to integration and optimization of dual microdevices.

SUMMARY

The present invention relates to a method of optimizing the performance of a pixel or a subpixel for a wider operation by integrating at least two microdevices with the same function in the pixel or the subpixel which each microdevice is optimized for in different operating conditions.

In another embodiment the invention relates to a method to integrate two microdevices in pixels or subpixels, the method comprising: connecting the two microdevices from at least one contact point in a series structure; and controlling the series structure through other accessible contact points.

In another embodiment, the invention relates to a method to integrate two microdevices in pixels or subpixels, the method comprising: connecting the two microdevices in parallel; and controlling the parallel microdevices structure by at least two contact points of each microdevice that are coupled to each other.

In another embodiment, the invention relates to a method to integrate two microdevices in pixels or sub pixels the method comprising: controlling the two microdevices separately and optimizing each microdevice for separate operations by biasing the microdevices differently for each operation condition.

BRIEF DESCRIPTION OF THE DRAWINGS

The foregoing and other advantages of the disclosure will become apparent upon reading the following detailed description and upon reference to the drawings.

Figure 1A:
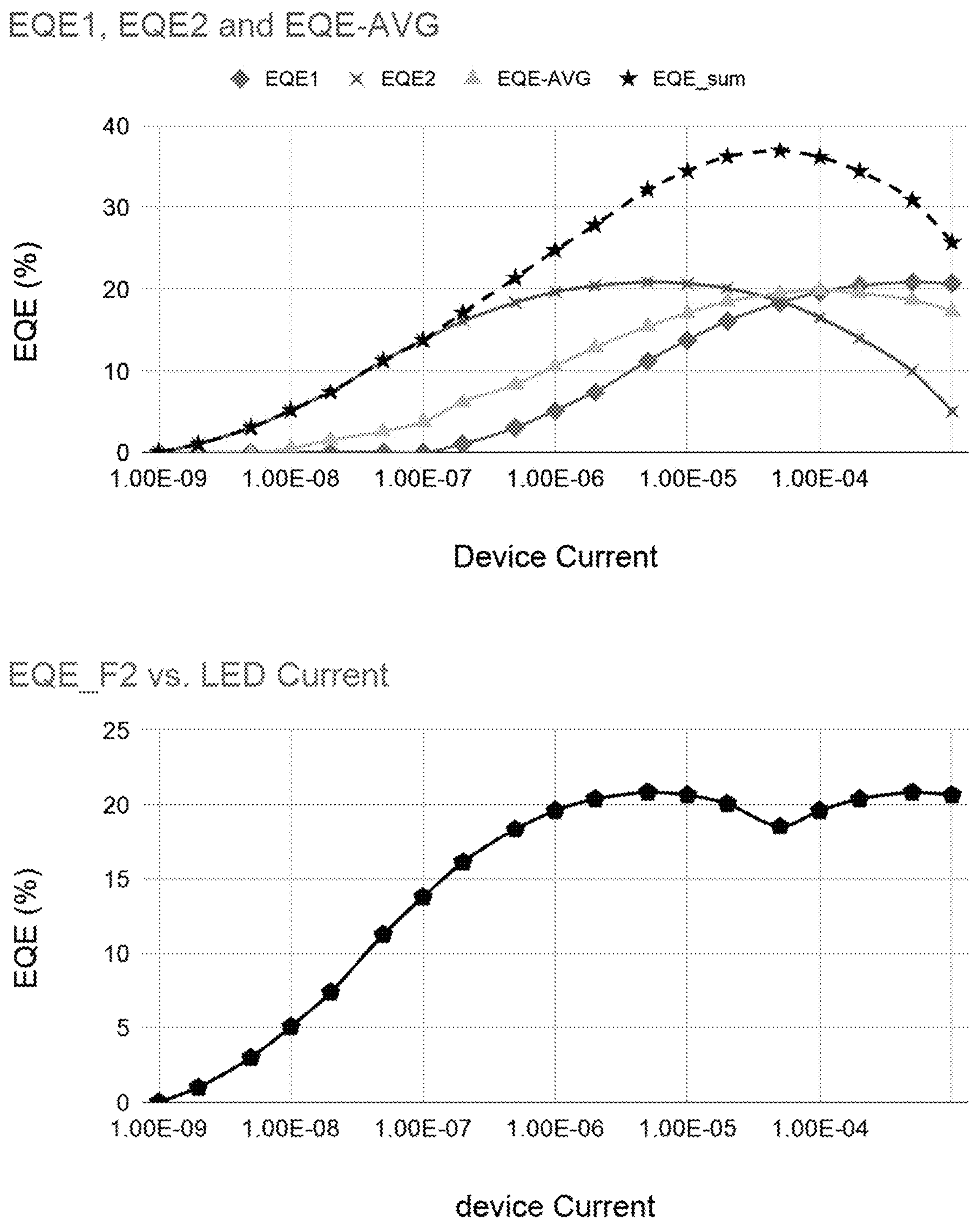
FIG. 1A shows different EQE curves for microdevices under different conditions.

The present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

In this description, the term "device" and "microdevice" are used interchangeably. However, it is clear to one skilled in the art that the embodiments described here are independent of the device size.

The microdevice can be in the form of microLED, micro sensors, MEMS, OLED, and other types of devices.

The microdevice can have different structures such as flip chip, vertical or lateral.

The microdevices are integrated in a system substrate to form a specific functionality such as creating lights or sensing a signal.

System substrate can be designed in the form of an array of pixels. Each pixel can have different sub pixels for different microdevice types. For example, in the case of microLED, the pixel can have red, green and blue subpixels.

Microdevice functionality can be hard to optimize across a wide operation regime. For example, in the case of microLED, the external quantum efficiency (EQE) is generally optimized across certain current levels. Therefore, if the device is required to operate outside that current level due to the content of the pixel, the microLED will be less efficient.

In one case at least two devices are integrated in the pixels (or sub pixels) where each device is optimized for certain operation conditions. The operating conditions can be different bias levels of microdevice, different temperature, different lighting conditions, or so on.

In a related embodiment (FIG. 1B), the devices 120 and 122 are connected at least from one contact point 124 in a series structure. Here, the series structure is controlled through other accessible contact points 128 and 126. The control signal can be the application of a current or coupling to a voltage level. If the microdevice is microLED and the control signal is current, the power output will be the sum of the power generated by two devices 120 and 122. As presented in FIG. 1A as EQE_sum curve. In the case of a sensor, the control signal (which is in the form of electrical positive/negative charge or current) will be averaged as demonstrated in FIG. 1A as EQE_AVG.

In one related case (FIG. 1C), the devices 120 and 122 are put in parallel where at least two contact points of each device are coupled to each other 128 and 124. In case of microLED, if the control signal is voltage the output power will be the sum of power generated by each device. If the control signal is current, the output power will be the weighted average of the two devices as demonstrated in FIG. 1A as EQE_AVG.

Figure 1B:
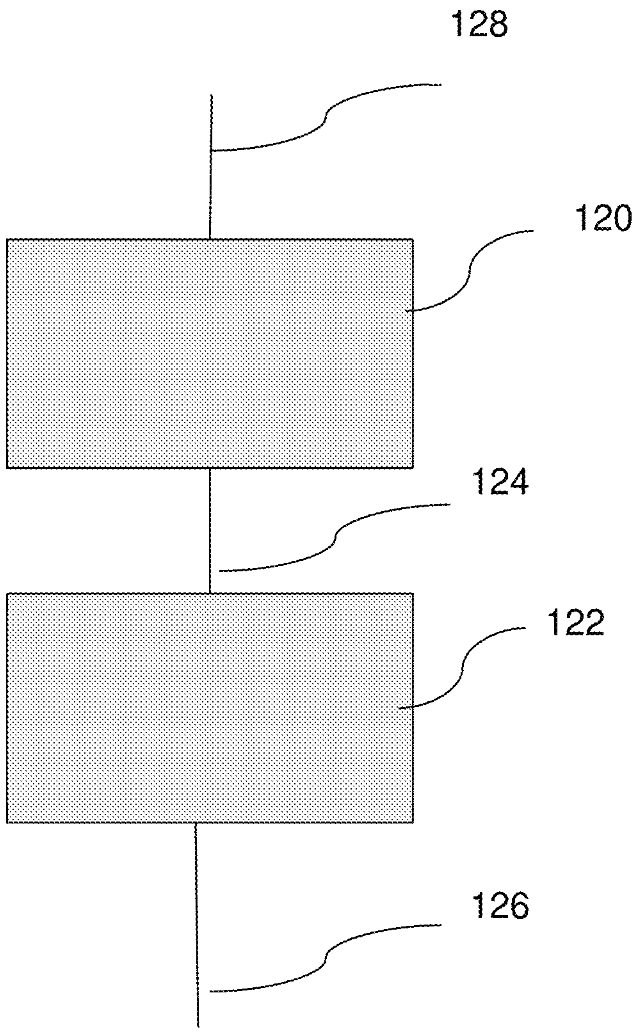
FIG. 1B shows two microdevices connected in series.
Figure 1C:
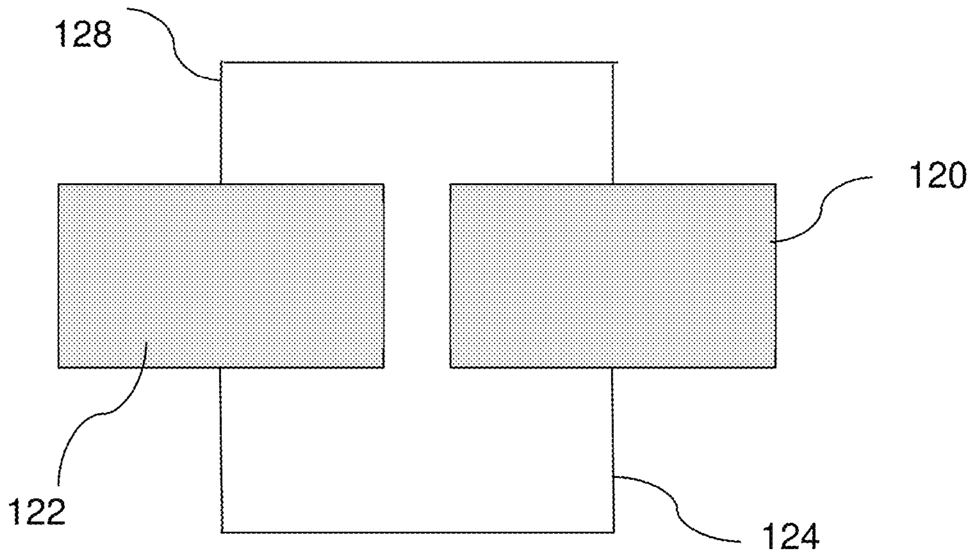
FIG. 1C shows two microdevices connected in parallel.
Figure 1D:
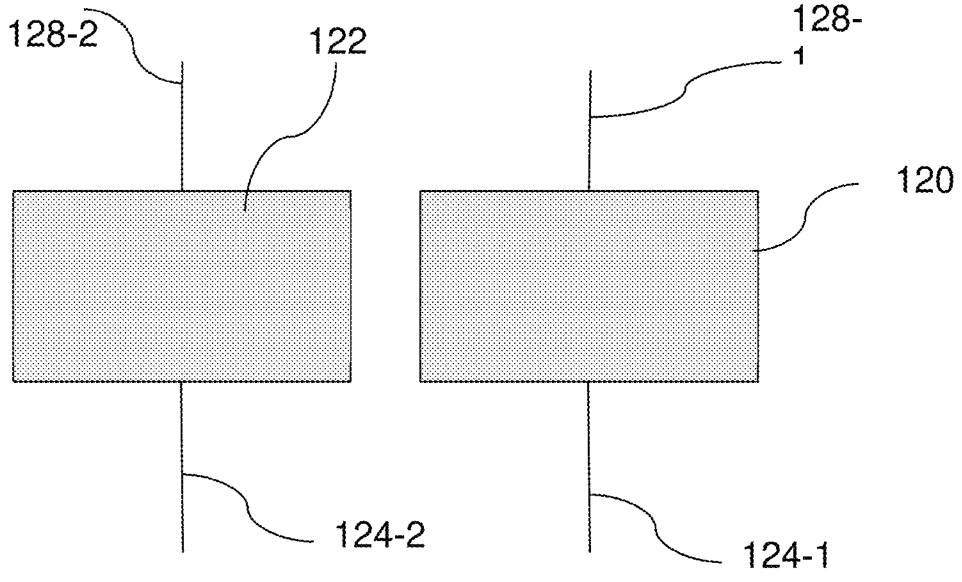
FIG. 1D shows two microdevices are controlled separately.

In another related case (FIG. 1D), the two devices are controlled separately to optimize the operation furthermore. Here, one device is functional for certain parts of operating conditions and the other device for other parts. Also the ratio of the two devices can be operated in some operating conditions. This can be achieved by biasing the devices differently for each operation condition. To avoid sudden change during switching one microdevice to another microdevice, a smoothing function can be used to transition between the two devices. In case of microLED, a first device 120 (with contact points 128-1 and 124-1) has a better EQE (EQE1 curve: FIG. 1A) in higher current levels while a second device 122 (with contact points 128-2 and 124-2) has a better EQE (EQE2 curve: FIG. 1A) in lower current density. Here, for lower current level, the microLED 122 is turned ON and for higher current level of operation microLED 120 turned ON. For a middle current level, the two devices can be ON, and the ratio of each device operation is decided by a smoothing function. The EQE_F2 curve in FIG. 1A highlights the effect of combining the two devices. As can be seen, the optimum operation of microdevices is extended significantly.

Figure 2:
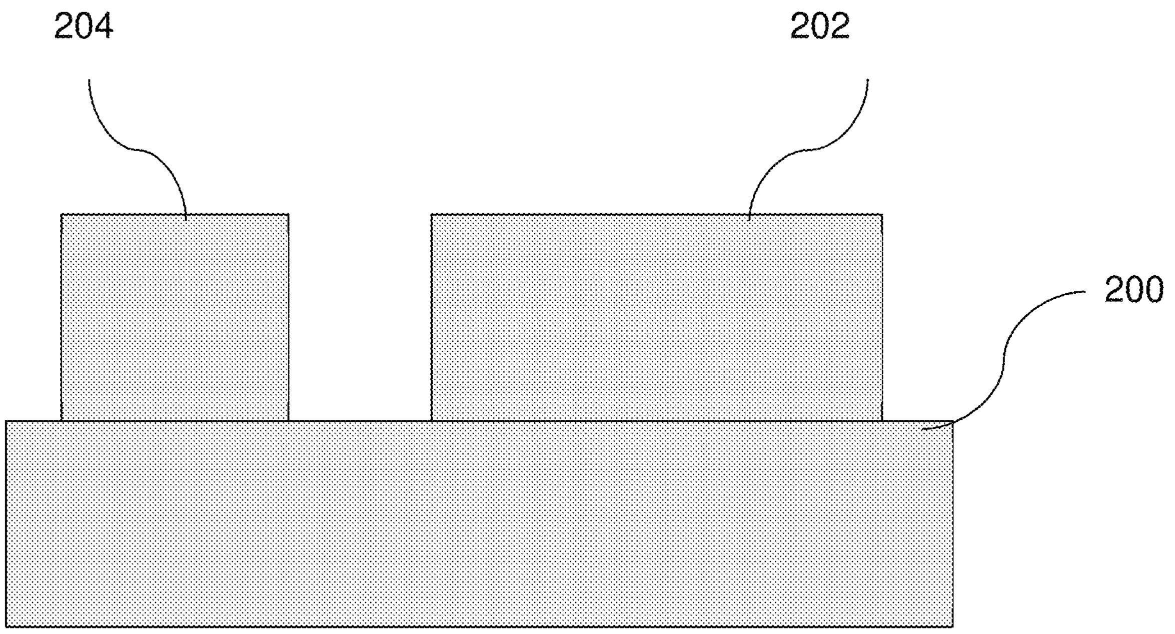
FIG. 2 shows two devices where they share common layers.

In one case the microdevices 120 and 122 can be two separated devices. In another case, the two microdevices can share some common layers. FIG. 2 shows two devices where they share common layers 200 and each have separated layers 204 and 202. The benefit of this structure is that only one structure is transferred and there is no need for two separate transfers of microdevices into a system substrate.

In a related case, the microdevices can have functional layers between current injection layers. In this case, one of the injection layers can be the common layers and the functional layers are separated.

In another case, one of charge injection layers and functional layers are common and the other charge injection layer is separated to form two different layers.

In a related case to change the microdevice characteristics, the sizes of the devices are different. In another related case, the material and structure of microdevices can be different to form different operation characteristics. For example, the EQE of microLED at different current levels changes based on the sizes of the microLED.

Methods Aspect

The invention discloses a method to integrate two microdevices in pixels or subpixels. The method comprises connecting two microdevices from at least one contact point in a series structure and controlling the series structure through other accessible contact points. Here, a control signal is the application of a current or coupling to a voltage level. In case of the control signal being a current, a power output will be the sum of the power generated by two microdevices, wherein the microdevices are microLED's. In the case that microdevices are sensors, the control signal is an average.

Furthermore, this method also comprises, controlling two microdevices separately; and optimizing each microdevice for separate operations by biasing the microdevices differently for each operation condition. Here, the ratio of the two devices is operated in different operating conditions by biasing the microdevices differently for each operation condition. Also, a smoothing function can be used to transition between the two microdevices. In the case of microLED's, the first microdevice has better EQE at higher current levels while a second microdevice has a better EQE at a lower current density. Furthermore, for lower current levels, the second microdevice is turned ON and for higher current level of operation the first microdevice is turned ON. Moreover, for a middle current level, the two microdevices are ON at the same time and the level of control signal for each said microdevice is decided by a smoothing function. Next, the two microdevices share some common layers and each have separated layers as well. They also have functional layers between current injection layers and one of the current injection layers is the common layer and the functional layers are separated. One of the charge injection layers and functional layers are common, and the other charge injection layer is separated to form two different layers. Here, the sizes of the two microdevices are different and the material and structure of microdevices are different to form different operation characteristics.

This invention further discloses a method of two microdevices in pixels or subpixels. The method comprises connecting two microdevices in parallel and controlling the parallel microdevices structure by at least two contact points of each microdevice that are coupled to each other. Here, a control signal is a voltage, and an output power is the sum of a power generated by each microdevice. Wherein the control signal is a current, the output power is a weighted average of the two microdevices.

The method further comprises, a method of optimizing the performance of a pixel or a subpixel for a wider operation by integrating at least two microdevices with the same function in the pixel or the subpixel which each microdevice is optimized for in different operating conditions. The microdevices can be microLED, microsensors or other devices; and the integration can be connecting the devices in series or in parallel or control them independently.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

I claim:

1. A method to integrate two microdevices in pixels or subpixels comprising:

connecting the two microdevices from at least one contact point in a series structure, wherein each of the two microdevices has a different operating characteristic, a first microdevice is optimized for a first operating condition and a second microdevice is optimized for a second operating condition different from the first operating condition, wherein integrating the two microdevices in the series structure in a pixel or subpixel provides a wider operational range than either microdevice alone; and controlling the series structure through other accessible contact points.

2. The method of claim 1, wherein a control signal is an application of a current or coupling to a voltage level.

3. The method of claim 2, wherein when the control signal is a current, a power output is a sum of the power generated by two microdevices.

4. The method of claim 3, wherein the microdevices are micro light emitting diodes (LEDs).

5. The method of claim 2, wherein the microdevices are sensors, the control signal is in the form of electrical positive or negative charge or current being averaged.

6. The method of claim 1, wherein the two microdevices share some common layers and each have separated layers as well.

7. The method of claim 6, wherein the two microdevices have functional layers between current injection layers and one of the current injection layers is the common layer and the functional layers are separated.

8. The method of claim 6, wherein one of charge injection layers and functional layers are common and the other charge injection layer is separated to form two different layers.

9. The method of claim 6, wherein sizes of the two microdevices are different.

10. The method of claim 6, wherein material and structure of microdevices are different to form different operation characteristics.

11. A method to integrate two microdevices in pixels or subpixels comprising:

connecting the two microdevices in parallel, wherein each of the two microdevices has a different operating characteristic, a first microdevice is optimized for a first operating condition and a second microdevice is optimized for a second operating condition different from the first operating condition, wherein integrating the two microdevices in parallel in a pixel or subpixel provides a wider operational range than either microdevice alone; and controlling the parallel microdevices structure by at least two contact points of each microdevice that are coupled to each other.

12. The method of claim 11, wherein when a control signal is a voltage, a power output is a sum of power generated by each microdevice.

13. The method of claim 11, wherein when a control signal is a current, a power output is a weighted average of power of the two microdevices.

14. The method of claim 11, wherein the two microdevices share some common layers and each have separated layers as well.

15. A method to integrate two microdevices in pixels or sub pixels comprising:

controlling the two microdevices separately; and optimizing each microdevice for separate operations by biasing the microdevices differently for each operation condition, wherein the two microdevices are micro light emitting diodes (LEDs), a first microdevice has better external quantum efficiency (EQE) at higher current levels while a second microdevice has a better EQE at a lower current density, and wherein integrating the two microdevices in a pixel or subpixel provides a wider operational range of EQE than either microdevice alone.

16. The method of claim 15, wherein a ratio of the two microdevices is operated in different operating conditions by biasing the microdevices differently for each operation condition.

17. The method of claim 16, wherein a smoothing function is being used to transition between the two microdevices.

18. The method of claim 15, wherein for lower current levels of operation, the second microdevice is turned ON and for higher current level of operation, the first microdevice is turned ON.

19. The method of claim 15, wherein for a middle current level of operation, the two microdevices are ON at the same time and the level of control signal for each said microdevice is decided by a smoothing function.

* * * * *